United States Patent
Takasu et al.

(10) Patent No.: US 10,193,093 B2
(45) Date of Patent: Jan. 29, 2019

(54) RADIATION DETECTOR

(71) Applicant: Kabushiki Kaisha Toshiba, Minato-ku (JP)

(72) Inventors: Isao Takasu, Setagaya (JP); Atsushi Wada, Kawasaki (JP); Satomi Taguchi, Ota (JP); Mitsuyoshi Kobayashi, Ota (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/685,522

(22) Filed: Aug. 24, 2017

(65) Prior Publication Data

US 2018/0277779 A1 Sep. 27, 2018

(30) Foreign Application Priority Data

Mar. 21, 2017 (JP) .................. 2017-055135

(51) Int. Cl.
*H01L 51/42* (2006.01)
*G01T 1/24* (2006.01)
*H01L 51/00* (2006.01)

(52) U.S. Cl.
CPC ............ *H01L 51/426* (2013.01); *G01T 1/242* (2013.01); *H01L 51/0036* (2013.01); *H01L 51/0043* (2013.01); *H01L 51/0047* (2013.01); *H01L 2251/301* (2013.01); *H01L 2251/303* (2013.01)

(58) Field of Classification Search
CPC . H01L 51/426; H01L 51/0036; H01L 51/043; H01L 51/047
USPC .................................................. 250/370.12
See application file for complete search history.

(56) References Cited

U.S. PATENT DOCUMENTS

| 6,303,943 B1 | 10/2001 | Yu et al. |
| 6,441,395 B1 | 8/2002 | Yu et al. |
| 2011/0095266 A1 | 4/2011 | Hayden et al. |

(Continued)

FOREIGN PATENT DOCUMENTS

| JP | 2002-502128 | 1/2002 |
| JP | 2002-502129 | 1/2002 |
| JP | 5460706 | 4/2014 |

OTHER PUBLICATIONS

G.N. Ankah et al. "PbS quantum dot based hybrid-organic photodetectors for X-ray sensing," Organic Electronics 33, 2016, www.elsevier.com/locate/orgel, pp. 6.

*Primary Examiner* — David Porta
*Assistant Examiner* — Meenakshi Sahu
(74) *Attorney, Agent, or Firm* — Oblon, McClelland, Maier & Neustadt, L.L.P.

(57) ABSTRACT

According to one embodiment, a radiation detector includes a first conductive layer, a second conductive layer, and an intermediate layer. The intermediate layer is provided between the first conductive layer and the second conductive layer. The intermediate layer includes an organic semiconductor region and a plurality of particles. The organic semiconductor region including a portion provided around the particles. A diameter is not less than 1 nanometer and not more than 20 nanometers for at least a portion of the particles. A first bandgap energy of the plurality of particles is larger than a second bandgap energy of the organic semiconductor region.

7 Claims, 4 Drawing Sheets

(56) References Cited

U.S. PATENT DOCUMENTS

2015/0060676 A1* 3/2015 Couture .............. G01T 1/2018
  250/366
2017/0005283 A1* 1/2017 Al-Ghamdi ......... H01L 51/4233

* cited by examiner

RADIATION DETECTOR

CROSS-REFERENCE TO RELATED APPLICATIONS

This application is based upon and claims the benefit of priority from Japanese Patent Application No. 2017-055135, filed on Mar. 21, 2017; the entire contents of which are incorporated herein by reference.

FIELD

Embodiments described herein relate generally to a radiation detector.

BACKGROUND

It is desirable to increase the efficiency of radiation detector.

DETAILED DESCRIPTION

Figure 1:
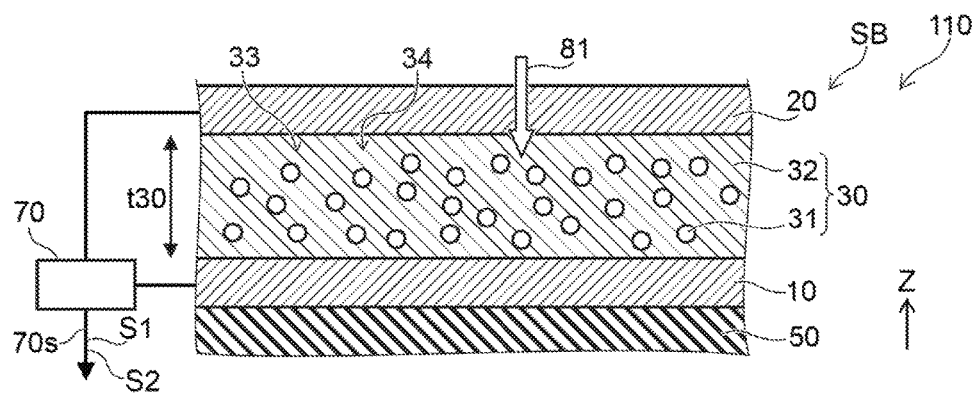
FIG. 1 is a schematic cross-sectional view illustrating a radiation detector according to a first embodiment.

According to one embodiment, a radiation detector includes a first conductive layer, a second conductive layer, and an intermediate layer. The intermediate layer is provided between the first conductive layer and the second conductive layer. The intermediate layer includes an organic semiconductor region and a plurality of particles. The organic semiconductor region including a portion provided around the particles. A diameter is not less than 1 nanometer and not more than 20 nanometers for at least a portion of the particles. A first bandgap energy of the plurality of particles is larger than a second bandgap energy of the organic semiconductor region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a radiation detector according to a first embodiment.

As shown in FIG. 1, the radiation detector 110 according to the first embodiment includes a first conductive layer 10, a second conductive layer 20, and an intermediate layer 30. The intermediate layer 30 is provided between the first conductive layer 10 and the second conductive layer 20. A substrate 50 is provided in the example. The first conductive layer 10 is positioned between the substrate 50 and the second conductive layer 20.

A direction from the first conductive layer 10 toward the second conductive layer 20 is taken as a Z-axis direction. The Z-axis direction is the stacking direction of the first conductive layer 10, the intermediate layer 30, and the second conductive layer 20. These layers spread along a plane substantially perpendicular to the Z-axis direction.

The intermediate layer 30 includes an organic semiconductor region 32 and multiple particles 31. The organic semiconductor region 32 includes a portion provided around the multiple particles 31. For example, the multiple particles 31 are dispersed in the organic semiconductor region 32. At least two of the multiple particles 31 may be separated from each other. At least two of the multiple particles 31 may contact each other. For example, the organic semiconductor region 32 surrounds the periphery of at least a portion of the multiple particles 31. A portion of one of the multiple particles 31 may be exposed from the organic semiconductor region 32.

The organic semiconductor region 32 includes an organic semiconductor material. The organic semiconductor region 32 includes, for example, an n-type semiconductor region 33 and a p-type semiconductor region 34. The n-type semiconductor region 33 and the p-type semiconductor region 34 may be stacked with each other. Multiple n-type semiconductor regions 33 and multiple p-type semiconductor regions 34 may be mixed with each other. The organic semiconductor region 32 includes, for example, a polymer. Examples of the organic semiconductor region 32 are described below.

The first conductive layer 10 and the second conductive layer 20 function as electrodes. Radiation 81 is incident on a stacked body SB including the first conductive layer 10, the second conductive layer 20, and the intermediate layer 30. At least one of the first conductive layer 10 or the second conductive layer 20 is transmissive to the radiation 81. In the example, the radiation 81 is incident on the intermediate layer 30 via the second conductive layer 20. A movable charge is generated in the intermediate layer 30 by the energy of the radiation 81. The amount of the charge is dependent on, for example, the intensity of the energy of the radiation 81. The charge is extracted by applying a bias voltage between the first conductive layer 10 and the second conductive layer 20.

For example, a detection circuit 70 is provided. The detection circuit 70 is electrically connected to the first conductive layer 10 and the second conductive layer 20. The detection circuit 70 is configured to output a signal 70s corresponding to the intensity of the radiation 81 incident on the stacked body SB.

In the embodiment, the diameter is not less than 1 nanometer (nm) and not more than 20 nm for at least a portion of the multiple particles 31. The multiple particles 31 are, for example, "nanoparticles."

In the embodiment, the bandgap energy (a first bandgap energy) of the multiple particles 31 is larger than the bandgap energy (a second bandgap energy) of the organic semiconductor region 32.

The radiation can be detected with high efficiency by this configuration. As described below, for example, the radiation 81 is incident on the stacked body SB. When the radiation 81 is irradiated on the multiple particles 31, the multiple particles 31 are excited by the energy of the radiation 81. The excited energy is transferred from the multiple particles 31 to the organic semiconductor region 32. It is considered that the transfer is, for example, a direct transfer that does not accompany a light emission process of the particles. It is estimated that this is the reason that the high efficiency is obtained.

For example, the multiple particles 31 include at least one of zinc oxide (ZnO), zinc sulfide (ZnS), or zinc selenide (ZnSe). The bandgap energy of ZnO is about 3.44 eV. The bandgap energy of ZnS is about 3.84 eV to about 3.91 eV. The bandgap energy of ZnSe is about 2.83 eV. The bandgap energies of these materials are relatively large.

On the other hand, the second bandgap energy of the material of the organic semiconductor region 32 is, for example, not less than 1.0 eV and not more than 3.0 eV.

An example of the conversion of the energy of the intermediate layer 30 when the radiation 81 is incident on the intermediate layer 30 will now be described.

Figure 2:
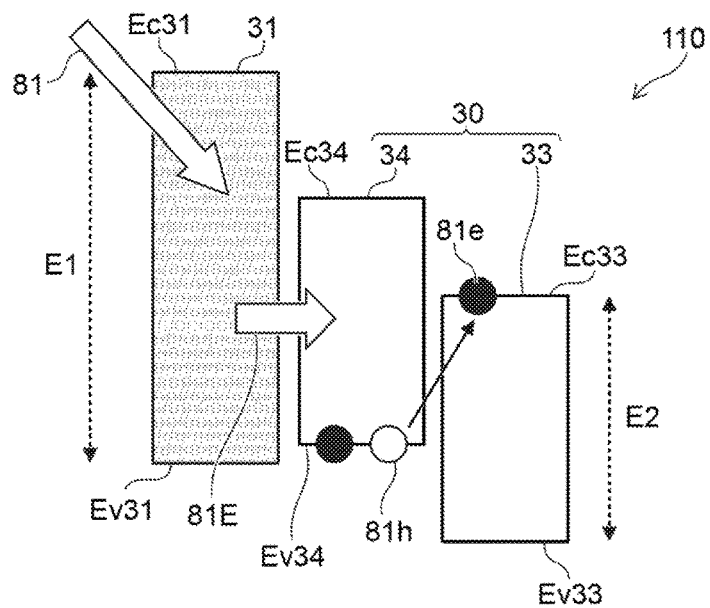
FIG. 2 is a schematic view illustrating the energy bands of the radiation detector according to the first embodiment.

FIG. 2 is a schematic view illustrating the energy bands of the radiation detector according to the first embodiment.

FIG. 2 illustrates energy Ec31 of the conduction band of the particles 31, energy Ev31 of the valence band of the particles 31, energy Ec33 of the conduction band of the n-type semiconductor region 33, energy Ev33 of the valence band of the n-type semiconductor region 33, energy Ec34 of the conduction band of the p-type semiconductor region 34, and energy Ev34 of the valence band of the p-type semiconductor region 34.

The bandgap energy (the first bandgap energy E1) of the particles 31 is the difference between the energy Ec31 and the energy Ev31.

The bandgap energy of the n-type semiconductor region 33 is the difference between the energy Ec33 and the energy Ev33.

The bandgap energy of the p-type semiconductor region 34 is the difference between the energy Ec34 and the energy Ev34.

In the case where the organic semiconductor region 32 includes multiple regions (e.g., the n-type semiconductor region 33, the p-type semiconductor region 34, etc.), the average of the bandgap energies of the multiple regions can be used as the second bandgap energy E2 of the organic semiconductor region 32. Here, the second bandgap energy E2 in the example shown in FIG. 2 is shown as the difference between the energy Ec33 and the energy Ev33.

In the radiation detector 110 as shown in FIG. 2, the first bandgap energy E1 is larger than the second bandgap energy E2.

The radiation 81 is irradiated on the particles 31. The particles 31 are excited. Energy 81E of the excitation is transferred to the organic semiconductor region 32 (in the example, the p-type semiconductor region 34). Accordingly, the p-type semiconductor is excited. Subsequently, electrons 81e that are excited move from the p-type semiconductor region 34 to the n-type semiconductor region 33. For example, such an energy transfer occurs. Thus, charge (electrons and holes) are generated based on the radiation 81. The electrons can move through the n-type semiconductor region 33. The holes can move through the p-type semiconductor region 34.

As recited above, for the multiple particles 31, the diameter is not less than 1 nm and not more than 20 nm and is extremely small. For example, the distance is short between the excitons generated in the particles 31 and the organic semiconductor region 32 adjacent to the particles 31. The excitation energy of the particles 31 is transferred to the organic semiconductor region 32; and excitons are generated in the organic semiconductor region 32. Therefore, light emission based on the energy 81E excited in the particles 31 is suppressed.

For example, there is a first reference example in which a material such as ZnS or the like is used as the scintillator layer. In the first reference example, such a scintillator layer is stacked with a semiconductor layer (a photoelectric conversion layer). When the radiation is irradiated on the scintillator layer, the scintillator layer emits light. The emitted light is incident on the semiconductor layer. In the semiconductor layer, the emitted light is converted into an electrical signal. Such a first reference example has the two processes of the light emission and the photoelectric conversion. An energy loss occurs in the light emission and the absorption. Therefore, the increase of the efficiency is limited.

Conversely, in the embodiment, the diameters of the multiple particles 31 are extremely small. Therefore, the light emission is suppressed. The energy is directly transferred from the particles 31 to the organic semiconductor region 32. The energy loss decreases. Thereby, a high efficiency is obtained.

In the embodiment, for example, when the radiation 81 is incident on the stacked body SB, the energy transfer occurs from the multiple particles 31 to the organic semiconductor region 32. The energy transfer is direct. For example, the processes that include the light emission and the absorption substantially do not occur. A high efficiency is obtained.

On the other hand, for example, there are various radiation such as α-rays, β-rays, γ-rays, X-rays, etc. Among these, X-rays and the like are used in medical care, etc.; the X-rays that are generated are irradiated on an object; and various diagnoses are performed. Conversely, there are cases where α-rays, β-rays, and γ-rays are used to detect, for example, residual radioactive substances. For example, β-rays, etc., are used to determine whether or not radioactive substances are adhered. It is desirable to detect β-rays with high sensitivity. On the other hand, other than β-rays, there are many cases where γ-rays are emitted from the residual radioactive substances. In such a case, the β-rays are masked by the γ-rays; and the highly-sensitive detection of the β-rays is difficult. It is considered that it is possible to detect the desired β-rays with high sensitivity by causing the sensitivity to γ-rays not to be high, while causing the sensitivity to β-rays to be high.

In the embodiment, the particles 31 that have a large bandgap energy are used. Thereby, radiation (e.g., β-rays) for which highly-sensitive detecting is particularly desirable can be detected with high sensitivity. For example, high sensitivity to β-rays is obtained without increasing the sensitivity to γ-rays.

For example, the metallic element that is included in the particles 31 having the large bandgap energy is, for example, Zn, Se, etc. The atomic numbers of these elements are larger than the atomic numbers of the carbon, hydrogen, nitrogen, sulfur, etc., included in the organic semiconductor region 32 but smaller than the atomic numbers of lead, bismuth, etc., which easily absorb γ-rays or X-rays. For example, the mass of the metallic element included in the particles 31 is relatively small. Therefore, the sensitivity to high-energy γ-rays, X-rays, or the like is low for materials including these elements. For example, the sensitivity to β-rays is relatively high for the materials including these materials.

On the other hand, a second reference example may be considered in which the particles 31 that have a small bandgap energy are used. The second reference example will now be described.

Figure 3:
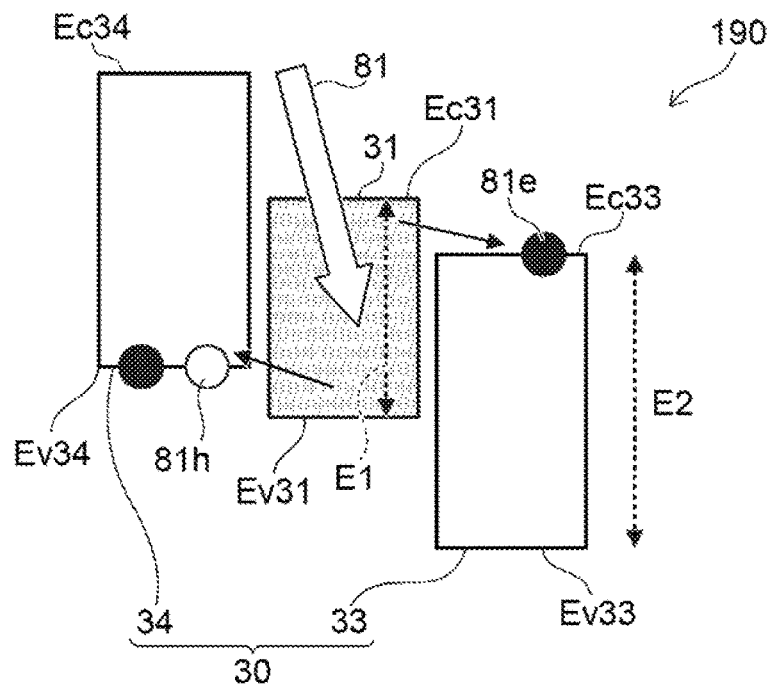
FIG. 3 is a schematic view illustrating the energy bands of a radiation detector of the second reference example.

FIG. 3 is a schematic view illustrating the energy bands of a radiation detector of the second reference example.

In the radiation detector 190 of the second reference example as shown in FIG. 3, the first bandgap energy E1 of the particles 31 is smaller than the second bandgap energy E2 of the organic semiconductor region 32. For example, PbS is used as such particles 31. The bandgap energy of PbS is about 1.2 eV.

In such a case, excitons are generated when the radiation 81 is irradiated on the particles 31. The electrons 81e move from the particles 31 toward the n-type semiconductor region 33 due to the bias voltage. On the other hand, holes 81h move from the particles 31 toward the p-type semiconductor region 34. Thus, it is considered that it is possible to extract charge corresponding to the radiation 81.

However, in the second reference example, it may be considered that the probability of the charge generation due to thermal excitation increases easily. In the second reference example, it is considered that the charge is injected easily from the conductive layer (the electrode) due to the relative relationship of the energy levels. Thereby, dark current easily becomes large. For example, it is considered that the SN ratio of the radiation detection is low. Therefore, it is difficult to obtain high sensitivity.

In the second reference example, the atomic number of the element included in the particles 31 having the small bandgap energy (e.g., PbS or the like) is large. Therefore, the particles 31 respond to γ-rays, X-rays etc. The sensitivity to β-rays is masked by the sensitivity to γ-rays (and X-rays, etc.) and the like. As a result, it is difficult to detect β-rays with high sensitivity in the case where γ-rays (and X-rays, etc.) and the like exist.

Conversely, in the radiation detector 110 according to the embodiment, for example, the dark current can be suppressed. For example, a high SN ratio is obtained. β-rays can be detected with high sensitivity even in the case where γ-rays, etc., exist.

On the other hand, a third reference example also may be considered in which an organic semiconductor layer is used without using a scintillator layer or particles. In such a case, the energy of the radiation 81 incident on the organic semiconductor layer is converted directly into the electrical signal. The trap efficiency of the radiation of the organic semiconductor material is low. Therefore, a thick organic semiconductor layer is used in the third reference example. In the case where the thick organic semiconductor layer is used, the bias voltage is high; and the detection circuit is complex. Also, it is difficult to practically form a thick layer of an organic semiconductor material.

Conversely, the multiple particles 31 are used in the embodiment. The trap efficiency of the radiation of the multiple particles 31 is higher than the trap efficiency of the radiation of the organic semiconductor layer. Therefore, the radiation 81 can be trapped with high efficiency. Therefore, the thickness of the intermediate layer 30 may not be, excessively thick. Thereby, for example, the bias voltage can be low; and the detection circuit 70 is simple. Also, the formation of the intermediate layer 30 is easy.

In the embodiment, a thickness t30 of the intermediate layer 30 (referring to FIG. 1) is, for example, not less than 1 micrometer (μm) and not more than 1000 micrometers (μm). Thereby, the bias voltage can be low; and the formation of the intermediate layer 30 also is easy. By being thin, for example, the increase of the sensitivity to γ-rays can be suppressed. The thickness t30 of the intermediate layer 30 is the length of the intermediate layer 30 along the Z-axis, direction (a first direction from the first conductive layer 10 toward the second conductive layer 20).

In the embodiment, the multiple particles 31 include a compound. An element that is included in the compound is included in the second to fourth periods of the periodic table. For example, the compound that is included in the multiple particles 31 substantially does not include an element included in the fifth to seventh periods of the periodic table. Thereby, for example, the sensitivity to γ-rays can be low. For example, high sensitivity to β-rays or α-rays is obtained.

As described above, for example, the multiple particles 31 include at least one of ZnO, ZnS, or ZnSe. In the case where the multiple particles 31 include at least one of these materials, the first bandgap energy of the multiple particles 31 corresponds to (the average of) the bandgap energies of at least one of these materials.

For example, the information that relates to the material included in the multiple particles 31 is obtained by, for example, an analysis method such as inductively coupled plasma optical emission spectrometry (ICP-OES), inductively coupled plasma mass spectrometry (ICP-MS), etc. The bandgap energy is substantially a unique physical property value of the material. The bandgap energy can be known if the material is known.

A bandgap energy hν has a relationship with the absorption wavelength. The bandgap energy hν (electron volts) and a peak wavelength λ (nm) of the absorption substantially have the following relationship.

$$h\nu=1239.8/\lambda$$

For example, the wavelength at the end of the absorption band can be known by verifying the spectral characteristics of the organic semiconductor region 32. The bandgap energy can be known from the wavelength of the end of the absorption band based on the formula recited above.

Figure 4:
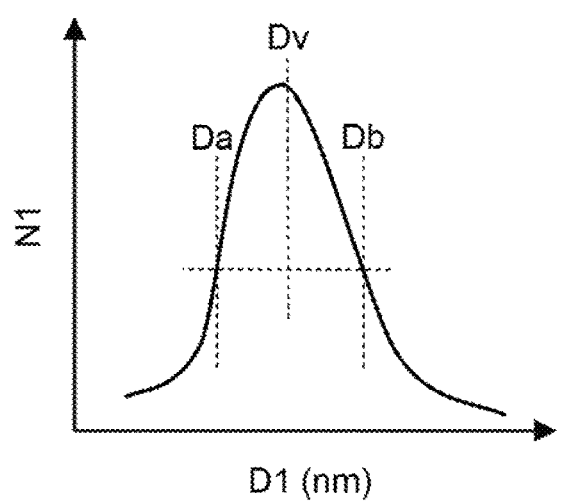
FIG. 4 is a graph illustrating a characteristic of components of a portion of the radiation detector according to the first embodiment.

FIG. 4 is a graph illustrating a characteristic of components of a portion of the radiation detector according to the first embodiment.

FIG. 4 shows the distribution of the diameter of the multiple particles 31 of the radiation detector 110 according to the embodiment. The horizontal axis of FIG. 4 is a diameter D1 (nanometers). The vertical axis is a number N1 (the count). The diameter D1 has a distribution as shown in FIG. 4. The distribution of the diameter D1 has an average value Dv. For example, in the embodiment, the average value Dv of the diameter D1 of the multiple particles 31 is not less than 1 nm and not more than 20 nm. For example, a value of ½ of the maximum value of the number N1 is obtained at a diameter Da and a diameter Db. The diameter Da is smaller than the average value Dv; and the diameter Db is larger than the average value Dv. In the embodiment, the diameter Db may be greater than 20 nm. The diameter Db may be, for example, 100 nm or less. In the embodiment, the diameter Da may be less than 1 nm. The diameter Da may be, for example, 0.6 nm or more. The diameter of at least a portion of the multiple particles 31 is not less than 1 nm and not more than 20 nm.

In the embodiment, there are cases where the particles 31 are substantially spherical. In such a case, the diameter D1 corresponds to the diameter of a sphere. In the embodiment, the length in one direction of the particle 31 may be different from the length in another direction. In such a case, the diameter D1 may be taken as the arithmetic average of the length in the one direction and the length in the other direction.

FIG. 5A to FIG. 5E are schematic views illustrating some components of the radiation detector according to the first embodiment.

These drawings illustrate materials included in the organic semiconductor region 32. As described above, the organic semiconductor region 32 includes, for example, the n-type semiconductor region 33 and the p-type semiconductor region 34.

Figure 5A:
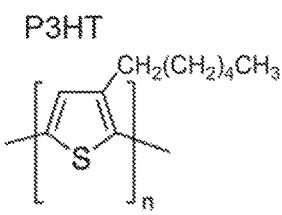
FIG. 5A to FIG. 5E are schematic views illustrating some components of the radiation detector according to the first embodiment.
Figure 5B:
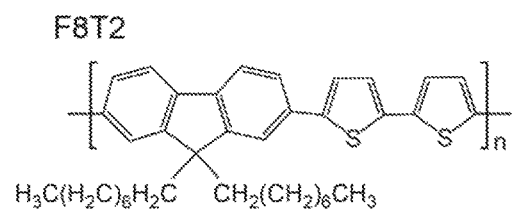
Figure 5C:
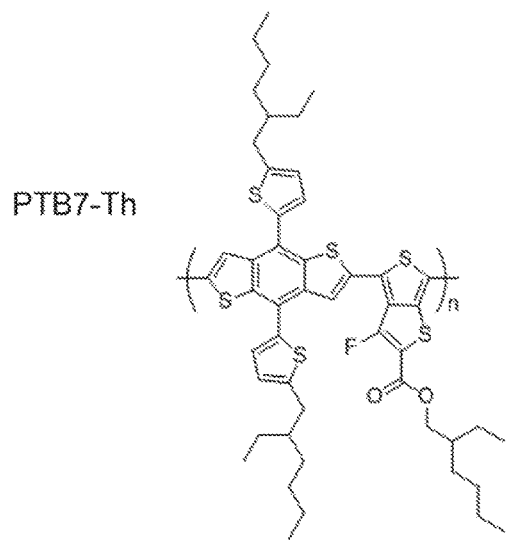

For example, the materials shown in FIG. 5A to FIG. 5C are used as the p-type semiconductor region 34. The p-type semiconductor region 34 includes, for example at least one selected from the group consisting of P3HT (poly(3-hexyl-thiophene) (referring to FIG. 5A), F8T2 (Poly[[2,2'-bithio-phene]-5,5'-diyl(9,9-dioctyl-9H-fluorene-2,7-diyl)]) (referring to FIG. 5B), and PTB7-Th (Poly[4,8-bis(5-(2-ethylhexyl) thiophen-2-yl)benzo[1,2-b;4,5-b]dithiophene-2,6-diyl-alt-(4-(2-ethylhexyl)-3-fluorothieno[3,4-b] thiophene-)-2-carboxylate-2-6-diyl)]) (referring to FIG. 5C). These materials are polymers.

Figure 5D:
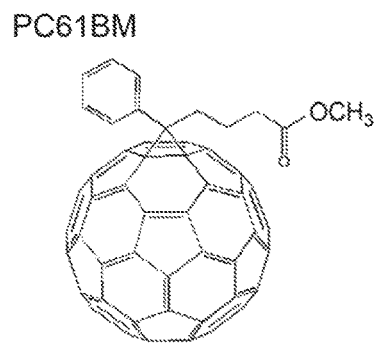
Figure 5E:
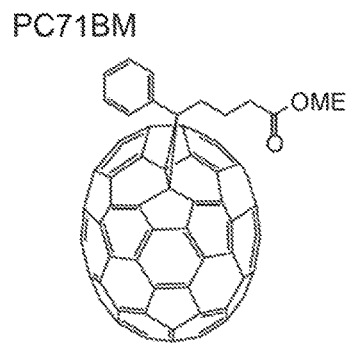

For example, the materials shown in FIG. 5D and FIG. 5E are used as the n-type semiconductor region 33. The n-type semiconductor region 33 includes, for example, at least one selected from the group consisting of PC61BM ([6,6]-Phenyl-C61-Butyric Acid Methyl Ester) and PC71BM ([6,6]-Phenyl-C71-Butyric Add Methyl Ester).

In the embodiment, the n-type semiconductor region 33 and the p-type semiconductor region 34 are mixed in the organic semiconductor region 32.

In the embodiment, the first conductive layer 10 and the second conductive layer 20 include, for example, metal oxide films. These conductive layers may include, for example, light-transmissive metal films. These conductive layers include, for example, at least one selected from the group consisting of indium oxide, zinc, oxide, tin oxide, indium tin oxide (ITO), and fluorine-doped tin oxide (FTO). These conductive layers include at least one selected from the group consisting of gold, platinum, silver, copper, and aluminum. These conductive layers may include an alloy including at least one selected from the group consisting of gold, platinum, silver, copper, and aluminum. The thicknesses of the first conductive layer 10 and the second conductive layer 20 each are, for example, not less than 10 nm and not more than 1000 nm.

In the embodiment, the substrate 50 includes, for example, at least one selected from the group consisting of glass, a resin, and a metal. The thickness of the substrate 50 is, for example, not less than 10 μm and not more than 10 cm.

For example, the first conductive layer 10 is formed on the substrate 50; and a material that is used to form the intermediate layer 30 is, for example, coated onto the first conductive layer 10. Subsequently, this material is solidified. Thereby, the intermediate layer 30 is obtained. The second conductive layer 20 is formed on the intermediate layer 30. Thereby, the radiation detector 110 is obtained.

An example of characteristics of the radiation detector 110 will now be described.

Figure 6:
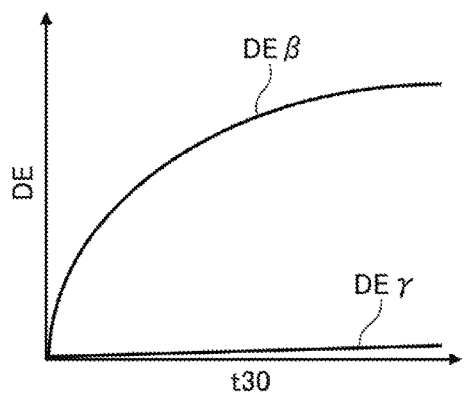
FIG. 6 is a graph illustrating the characteristics of the radiation detector according to the first embodiment.

FIG. 6 is a graph illustrating the characteristics of the radiation detector according to the first embodiment.

The horizontal axis of FIG. 6 is the thickness t30 of the intermediate layer 30. The vertical axis is a sensitivity DE of the radiation (and may be, for example, the detection rate). A sensitivity DEβ to β-rays and a sensitivity DEγ to γ-rays are illustrated in FIG. 6.

As shown in FIG. 6, the sensitivity DEβ is higher than the sensitivity DEγ. The sensitivity DEβ is high when the thickness t30 is thin. This is because the transmissivity to β-rays is lower than the transmissivity to γ-rays; and the β-rays are trapped efficiently in the intermediate layer 30 even in the case where the thickness t30 is thin. The sensitivity DE increases as the thickness t30 increases. Also, there is a tendency for the sensitivity DEβ to saturate in the region where the thickness t30 is large. On the other hand, when the sensitivity DEγ is low, the sensitivity DEγ increases slightly as the thickness t30 increases.

The radiation detector 110 may further include the detection circuit 70 electrically connected to the first conductive layer 10 and the second conductive layer 20 (referring to FIG. 1). The detection circuit 70 outputs a signal when the radiation 81 is incident on the stacked body SB.

For example, there are cases where the radiation 81 is β-rays. The detection circuit 70 outputs a first signal S1 when β-rays are incident on the stacked body SB (referring to FIG. 1).

For example, there are cases where the radiation 81 is γ-rays. The detection circuit 70 outputs a second signal S2 when γ-rays are incident on the stacked body SB (referring to FIG. 1).

For example, a first ratio (a first sensitivity) of the change of the first signal S1 to the change of the intensity of the β-rays is higher than a second ratio (a second sensitivity) of the change of the second signal S2 to the change of the intensity of the γ-rays.

Thus, for example, in the radiation detector 110, the first sensitivity to β-rays can be higher than the second sensitivity to γ-rays.

For example, β-rays and γ-rays may be incident on the radiation detector 110. The detection signal can be considered to be substantially based on β-rays.

For example, when a contaminated state due to radiation is detected, the detection of β-rays is useful to determine the contaminated state of the surface. According to the embodiment, for example, the β-rays can be detected with good selectivity. The dark current can be suppressed. A radiation detector that has a large surface area is obtained.

Second Embodiment

Figure 7:
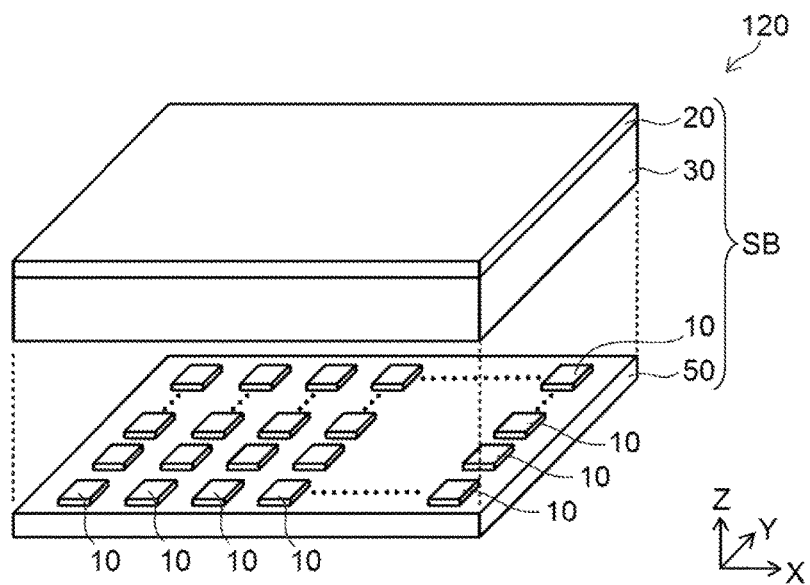
FIG. 7 is a schematic cross-sectional view illustrating a radiation detector according to a second embodiment.

FIG. 7 is a schematic cross-sectional view illustrating a radiation detector according to a second embodiment.

As shown in FIG. 7, the first conductive layer 10, the second conductive layer 20, and the intermediate layer 30 are provided in the radiation detector 120. The substrate 50 may be further provided. In FIG. 7, some of the components included in the radiation detector 120 are drawn as being separated from each other for easier viewing of the drawing.

Multiple first conductive layers 10 are provided in the radiation detector 120. The multiple first conductive layers 10 are arranged along a plane (e.g., the X-Y plane) crossing the first direction (the Z-axis direction) from one of the multiple first conductive layers 10 toward the second conductive layer 20. The X-Y plane is perpendicular to the Z-axis direction.

The multiple first conductive layers 10 are arranged along, for example, the X-axis direction and the Y-axis direction. For example, the multiple first conductive layers 10 are arranged in a matrix configuration.

An image that corresponds to the radiation 81 is obtained in the radiation detector 120. The configuration described in reference to the first embodiment and modifications of the configuration are applicable to the radiation detector 120. In the radiation detector 120 as well, a radiation detector can be provided in which the precision can be increased.

According to the embodiments, a radiation detector can be provided in which the efficiency can be increased.

In this specification, the state of being electrically connected includes the state in which two conductors are in direct contact. The state of being electrically connected includes the state in which two conductors are connected by another conductor (e.g., an interconnect, etc.). The state of being electrically connected includes the state in which a switching element (a transistor, etc.) is provided in the path between two conductors so that a state in which a current flows in the path between the two conductors is formable.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as conductive layers, intermediate layers, substrates, particles, semiconductor regions, n-type semiconductor regions, p-type semiconductor regions, detection, circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors practicable by an appropriate design modification by one skilled in the art based on the radiation detectors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
a first conductive layer;
a second conductive layer; and
an intermediate layer provided between the first conductive layer and the second conductive layer, the intermediate layer comprising an organic semiconductor region and a plurality of particles which comprise zinc selenide, the organic semiconductor region comprising a portion provided around the particles, a diameter being not less than 1 nanometer and not more than 20 nanometers for at least a portion of the particles, a first bandgap energy of the plurality of particles being larger than a second bandgap energy of the organic semiconductor region.

2. The detector according to claim 1, wherein a thickness of the intermediate layer along a first direction is not less than 1 micrometer and not more than 1000 micrometers, the first direction being from the first conductive layer toward the second conductive layer.

3. The detector according to claim 1, wherein the organic semiconductor region comprises an n-type semiconductor region and a p-type semiconductor region.

4. The detector according to claim 1, wherein an energy transfer occurs from the particles to the organic semiconductor region when radiation is incident on a stacked body comprising the first conductive layer, the second conductive layer, and the intermediate layer.

5. The detector according to claim 1, further comprising a detection circuit electrically connected to the first conductive layer and the second conductive layer,
the detection circuit outputting a signal corresponding to an intensity of radiation incident on a stacked body comprising the first conductive layer, the second conductive layer, and the intermediate layer.

6. The detector according to claim 1, further comprising a detection circuit electrically connected to the first conductive layer and the second conductive layer,
the detection circuit outputting a first signal when β-rays are incident on a stacked body comprising the first conductive layer, the second conductive layer, and the intermediate layer,
the detection circuit outputting a second signal when γ-rays are incident on the stacked body,
a first ratio of a change of the first signal to a change of an intensity of the β-rays being higher than a second ratio of a change of the second signal to a change of an intensity of the γ-rays.

7. The detector according to claim 1, wherein an average diameter of the particles is not less than 1 nanometer and not more than 20 nanometers.

* * * * *